(12) United States Patent
Lee et al.

(10) Patent No.: US 9,910,101 B2
(45) Date of Patent: Mar. 6, 2018

(54) METHOD FOR MANAGING BATTERY OF ELECTRONIC DEVICE AND ELECTRONIC DEVICE PERFORMING THE SAME

(71) Applicant: Samsung Electronics Co., Ltd., Gyeonggi-do (KR)

(72) Inventors: Chung Ik Lee, Gyeongsangbuk-do (KR); Hun Cheol Oh, Seoul (KR)

(73) Assignee: Samsung Electronics Co., Ltd (KR)

( * ) Notice: Subject to any disclaimer, the term of this patent is extended or adjusted under 35 U.S.C. 154(b) by 240 days.

(21) Appl. No.: 14/717,404

(22) Filed: May 20, 2015

(65) Prior Publication Data

US 2015/0338469 A1  Nov. 26, 2015

(30) Foreign Application Priority Data

May 20, 2014  (KR) .................. 10-2014-0060193

(51) Int. Cl.
*G01N 27/416* (2006.01)
*H02J 7/00* (2006.01)
(Continued)

(52) U.S. Cl.
CPC ..... *G01R 31/3686* (2013.01); *G01R 31/3606* (2013.01); *G01R 31/3634* (2013.01); *G01R 31/3655* (2013.01); *G06F 1/3212* (2013.01); *G06F 1/3234* (2013.01); *G06F 11/3062* (2013.01); *G06F 11/324* (2013.01); *G06F 11/3423* (2013.01); *H02J 7/0047* (2013.01); *H04W 52/0254* (2013.01); *H04W 52/0258* (2013.01); *G01R 31/3651* (2013.01); *G01R 31/3682* (2013.01); *H02J 2007/005* (2013.01);
(Continued)

(58) Field of Classification Search
CPC ................................................. G01R 31/3686
USPC ........................................................ 320/114
See application file for complete search history.

(56) References Cited

U.S. PATENT DOCUMENTS 6,501,968 B1  12/2002  Ichimura
8,280,456 B2  10/2012  Hackborn et al.
(Continued)

FOREIGN PATENT DOCUMENTS

KR  1020030028235  4/2003
KR  1020050014073  2/2005
(Continued)

OTHER PUBLICATIONS

European Search Report dated Sep. 3, 2015 issued in counterpart application No. 15168199.6-1959, 9 pages.
(Continued)

*Primary Examiner* — Edward Tso
*Assistant Examiner* — Ahmed Omar
(74) *Attorney, Agent, or Firm* — The Farrell Law Firm, P.C.

(57) ABSTRACT

A method for displaying battery information of an electronic device is provided. The method includes obtaining an operating history about one or more operations performed by the electronic device; determining a power use ratio about each of the one or more operations, based on the operating history; and determining an available time period for which a battery supplying power to the electronic device is capable to supply power to the electronic device, based on the power use ratio and a remaining capacity of the battery.

20 Claims, 5 Drawing Sheets

(51) Int. Cl.
| | |
|---|---|
| *G01R 31/36* | (2006.01) |
| *G06F 1/32* | (2006.01) |
| *H04W 52/02* | (2009.01) |
| *G06F 11/30* | (2006.01) |
| *G06F 11/32* | (2006.01) |
| *G06F 11/34* | (2006.01) |
| *H04M 1/725* | (2006.01) |

(52) U.S. Cl.
CPC ...... *H04M 1/72572* (2013.01); *Y02B 60/1292* (2013.01); *Y02B 60/50* (2013.01)

(56) References Cited

U.S. PATENT DOCUMENTS

| | | |
|---|---|---|
| 8,285,340 B2 | 10/2012 | Hackborn et al. |
| 8,380,999 B1 | 2/2013 | Robison et al. |
| 8,515,499 B1 | 8/2013 | Stekkelpak et al. |
| 9,058,128 B1 | 6/2015 | Robison et al. |
| 2006/0135217 A1 | 6/2006 | Sung et al. |
| 2011/0040996 A1 | 2/2011 | Hackborn et al. |
| 2011/0109613 A1 | 5/2011 | Asai et al. |
| 2012/0015695 A1 | 1/2012 | Hackborn et al. |
| 2013/0042122 A1* | 2/2013 | Hackborn ........... G06F 11/3409 713/300 |
| 2013/0135509 A1 | 5/2013 | Fuji |
| 2013/0162430 A1 | 6/2013 | Scherzer et al. |
| 2014/0068314 A1* | 3/2014 | Kim ................... G06F 1/3212 713/340 |

FOREIGN PATENT DOCUMENTS

| | | |
|---|---|---|
| KR | 1020080079144 | 8/2008 |
| KR | 1020120090501 | 8/2012 |
| KR | 1020130093970 | 8/2013 |
| KR | 1020130106740 | 9/2013 |

OTHER PUBLICATIONS

European Search Report dated Nov. 3, 2016 issued in counterpart application No. 15168199.6-1959, 9 pages.
International Search Report dated Aug. 3, 2015 issued in counterpart application No. PCT/KR2015/005021, 14 pages.
European Search Report dated Jan. 8, 2018 issued in counterpart application No. 15168199.6-1879, 9 pages.

* cited by examiner

METHOD FOR MANAGING BATTERY OF ELECTRONIC DEVICE AND ELECTRONIC DEVICE PERFORMING THE SAME

PRIORITY

This application claims priority under 35 U.S.C. § 119(a) to a Korean patent application filed on May 20, 2014 in the Korean Intellectual Property Office and assigned Serial number 10-2014-0060193, the entire disclosure of which is incorporated herein by reference.

BACKGROUND

1. Field of the Disclosure

The present disclosure generally relates to a method for providing battery related information of an electronic device and an electronic device performing the same.

2. Description of the Related Art

As a data communication speed and services provided by portable devices have diversified, power consumption of the portable devices has also increased.

Portable devices often display an indication of a remaining battery capacity in the form of a ratio (e.g., %) or by changing the size of a battery-shaped shade area. However, such methods for displaying the remaining capacity of the battery may not sufficiently indicate how long a user can utilize an application and after how long a portable device will be powered off. Moreover, a portable device may display a remaining capacity of a battery without considering an operating environment of the portable device.

SUMMARY

The present disclosure has been made to address at least the above-mentioned problems and/or disadvantages and to provide at least the advantages described below.

Accordingly, an aspect of the present disclosure is to provide a method and an electronic device capable of displaying battery related information.

An electronic device according to an embodiment of the present disclosure may extract and store a use environment or a use pattern of the electronic device in various methods and may provide battery related information using the stored data.

In accordance with an aspect of the present disclosure, a method for displaying battery information of an electronic device is provided. The method includes obtaining an operating history about one or more operations which the electronic device performs, determining a power use ratio about each of the one or more operations, based on the operating history, and determining an available time period for which a battery supplying power to the electronic device is capable to supply power to the electronic device, based on the power use ratio and a remaining capacity of the battery.

In accordance with another aspect of the present disclosure, a non-transitory computer-readable recording media is provided for recording a program. The program, when executed by a computer, causes the computer to perform a method including obtaining an operating history about one or more operations which an electronic device performs, determining a power use ratio about each of the one or more operations, based on the operating history, and determining an available time period for which a battery supplying power to the electronic device is capable to supply power to the electronic device, based on the power use ratio and a remaining capacity of the battery. In accordance with another aspect of the present disclosure, an electronic device is provided. The electronic device includes a capacity management module configured to detect a remaining capacity of a battery supplying power to the electronic device, and a control module configured to obtain an operating history about one or more operations which the electronic device performs, determine a power use ratio about the one or more operations, based on the operating history, and determine an available time period for which the battery is capable to supply power to the electronic device, based on the power use ratio and a remaining capacity of the battery.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION OF EMBODIMENTS OF THE PRESENT DISCLOSURE

Figure 1:
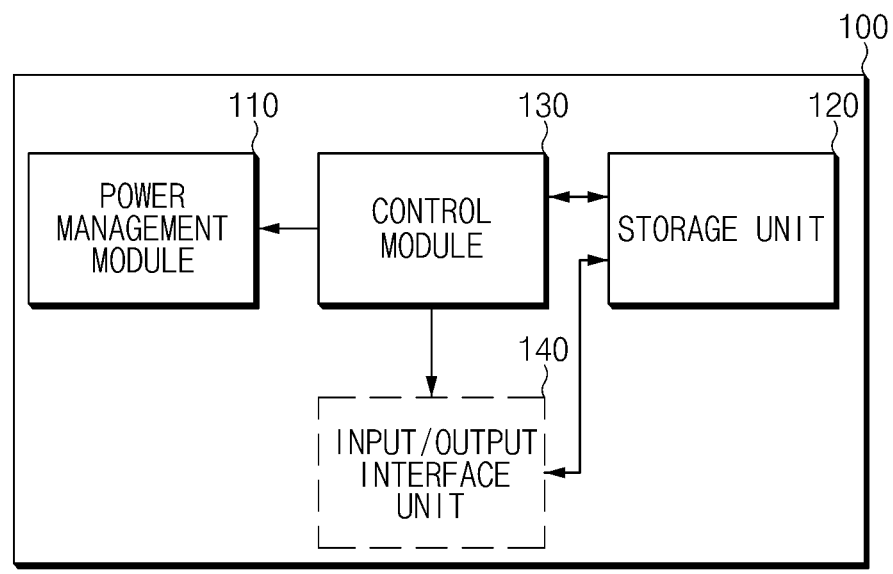
FIG. 1 is a block diagram illustrating a configuration of an electronic device according to an embodiment of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded merely as examples. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms "include," "comprise," "including," or "comprising" used herein indicate the existence of disclosed functions, operations, or elements, but do not exclude other functions, operations or elements. It should be further understood that the terms "include", "comprise", "have", "including", "comprising", or "having" used herein specify the presence of stated features, integers, operations, elements, components, or combinations thereof, but do not preclude the presence or addition of one or more other features, integers, operations, elements, components, or combinations thereof.

The terms "or" or "at least one of A and/or B" used herein include any combination of words listed together with the terms. For example, the expression "A or B" or "at least one of A and/or B" may indicate A, B, or both A and B.

The terms, such as "first", "second", and the like used herein may refer to various elements of various embodiments of the present disclosure, but do not limit the elements. For example, such terms do not limit the order and/or priority of the elements. Furthermore, such terms may be used to distinguish one element from another element. For example, "a first user device" and "a second user device" indicate different user devices. For example, without departing the scope of the present disclosure, a first element may be referred to as a second element, and similarly, a second element may be referred to as a first element.

It will be understood that when an element is referred to as being "connected" or "coupled" to another element, it can be directly connected or coupled to the other element or intervening elements may be present. In contrast, when an element is referred to as being "directly connected" or "directly coupled" to another element, it should be understood that there are no intervening elements.

The term "module" used herein may represent, for example, a unit including one or more combinations of hardware, software and firmware. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" according to various embodiments of the present disclosure may include at least one of an application-specific IC (ASIC) chip, a field-programmable gate array (FPGA), and a programmable-logic device for performing some operations, which are known or will be developed.

Terms used in this specification are used to describe embodiments of the present disclosure and are not intended to limit the scope of the present disclosure. The terms of a singular form may include plural forms unless otherwise specified.

Unless otherwise defined herein, all the terms used herein, which include technical or scientific terms, may have the same meaning as that generally understood by a person skilled in the art. It will be further understood that terms, which are defined in a dictionary and commonly used, should also be interpreted as being customary in the relevant related art and not in an idealized or overly formal sense unless expressly so defined herein in various embodiments of the present disclosure.

Electronic devices according to various embodiments of the present disclosure may include a communication function. For example, the electronic devices may include at least one of smartphones, tablet personal computers (PCs), mobile phones, video telephones, electronic book readers, desktop PCs, laptop PCs, netbook computers, personal digital assistants (PDAs), portable multimedia players (PMPs), Motion Picture Experts Group (MPEG-1 or MPEG-2) Audio Layer 3 (MP3) players, mobile medical devices, cameras, wearable devices (e.g., head-mounted-devices (HMDs), such as electronic glasses), an electronic apparel, electronic bracelets, electronic necklaces, electronic appcessories, electronic tattoos, smart watches, and the like.

According to various embodiments of the present disclosure, the electronic devices may be smart home appliances including metal cases. The smart home appliances may include at least one of, for example, televisions (TVs), digital versatile disc (DVD) players, audios, refrigerators, air conditioners, cleaners, ovens, microwave ovens, washing machines, air cleaners, set-top boxes, TV boxes (e.g., Samsung HomeSync™, Apple TV™, or Google TV™), game consoles, electronic dictionaries, electronic keys, camcorders, electronic picture frames, and the like.

According to various embodiments of the present disclosure, the electronic devices may include at least one of medical devices (e.g., a magnetic resonance angiography (MRA), a magnetic resonance imaging (MRI), a computed tomography (CT), scanners, and ultrasonic devices), navigation devices, global positioning system (GPS) receivers, event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller's machines (ATMs), and points of sales (POSs) including metal cases.

According to various embodiments of the present disclosure, the electronic devices may include at least one of parts of furniture or buildings/structures having communication functions, electronic boards, electronic signature receiving devices, projectors, and measuring instruments (e.g., water meters, electricity meters, gas meters, and wave meters) including metal cases. The electronic devices according to various embodiments of the present disclosure may be one or more combinations of the above-mentioned devices. Furthermore, the electronic devices according to various embodiments of the present disclosure may be flexible devices. It would be obvious to those skilled in the art that the electronic devices according to various embodiments of the present disclosure are not limited to the above-mentioned devices.

Hereinafter, electronic devices according to various embodiments of the present disclosure will be described with reference to the accompanying drawings. The term "user" used herein may refer to a person who uses an electronic device or may refer to a device (e.g., an artificial electronic device) that uses an electronic device.

FIG. 1 is a block diagram illustrating a configuration of an electronic device according to an embodiment of the present disclosure.

Referring to FIG. 1, an electronic device 100 includes a power management module 110, a storage unit 120, and a control module (or controller) 130. The electronic device 100 also includes an input/output interface unit 140.

Herein, components associated with the embodiment of the present disclosure will be merely described to prevent the scope of the present disclosure from becoming ambiguous. Accordingly, it will be understood that other universal components as well as components illustrated in FIG. 1 are further included. Also, the electronic device 100 according to various embodiments of the present disclosure may be connected with another electronic device or a server through a network.

According to an embodiment of the present disclosure, at least a portion of operations according to various embodiments of the present disclosure may be performed on another electronic device or a server connected with the electronic device 100 through a network. For example, the operations may include the basic system operation for operating the electronic device, and may further include image/video capturing, audio/video streaming, executing/terminating an application, sensing, sending/receiving an email, linking a website, and the like.

The electronic device 100 determines a battery available time period (i.e., an available time period for which a battery supplying power to the electronic device is capable to supply power to the electronic device) using an operating history about one or more operations performed thereon and notifies a user of the determination result. Further, the electronic device 100 utilizes charging history and provides notification about battery related information using the charging history of an electronic device.

The power management module 110 detects the remaining capacity of a battery, for example. According to an embodiment of the present disclosure, the power management module 110 may check the remaining capacity of the battery periodically. Alternatively, the power management module 110 may check the remaining capacity of the battery whenever an event is generated.

The storage unit 120 stores the operating history about one or more operations that the electronic device 100 performs. For example, the storage unit 120 may store cumulative use times, each obtained by accumulating a use time of each operation, with respect to the one or more operations of the electronic device 100 as the operating history. Alternatively, the storage unit 120 may store the charging history according to charging of the electronic device 100 as the operating history. The charging history may include, for example, at least one of a location where a battery was charged or a time when a battery was charged.

According to an embodiment of the present disclosure, the operating history may be information collected into database according to at least one of an application type or a use condition with respect to the one or more operations. For example, the use condition may be a communications network condition, a display condition, or the like.

As a general storage medium, the storage unit 120 stores data or a program needed to determine an available time period of a battery. Also, the storage unit 120 may further store data or a program needed to determine charging probability of the electronic device 100, for example, based on the charging history.

Further, the storage unit 120 may store a program routine(s) or an instruction set(s) needed for the control module 130 to control the power management module 110, the storage unit 120, or the input/output interface unit 140.

The storage unit 120 may store data or a program needed for an operation of the electronic device 100. The storage unit 120 according to an embodiment of the present disclosure may be implemented with a hard disk drive (HDD), a read only memory (ROM), a random access memory (RAM), a flash memory, a memory card, a NAND flash memory, a solid state drive (SSD), and the like.

The control module 130 determines the battery available time period, based on the remaining capacity of the battery and the operating history. The control module 130 may obtain, for example, the operating history about one or more operations executed on the electronic device 100 and may determine a power use ratio about the one or more operations, based on the operating history. The control module 130 may determine the battery available time period, based on the power use ratio and the remaining capacity of the battery.

For example, the control module 130 may obtain current consumption over an interval of time about at least one or more operations that the electronic device 100 performs, and may determine the quantity of charge consumed, based on the current consumption over an interval of time (charge=current×interval of time). When the quantity of charge consumed is determined, for example, the control module 130 may compare the quantity of the charge consumed with the remaining capacity of the battery to determine the battery available time period.

As a time elapses, for example, the control module 130 updates the operating history about the one or more operations or cumulative use time times, each obtained by accumulating a use time of each operation, with respect to the one or more operations. For example, the control module 130 may delete an operation of which the use time accumulated during a specified period is not changed, from the operating history. Also, the control module 130 may add an operation, which the operating history does not include, to the operating history. For example, the electronic device 100 may obtain the use time of each operation using use information, input information, output information, or the like about an application, a function, a mode, and the like being executed through an electronic device and may accumulate the use time obtained thereby.

The control module 130 determines the power use ratio, for example, based on the updated operating history. The control module 130 determines the battery available time period, based on the remaining capacity of the battery and the power use ratio about at least one or more operations that the electronic device 100 performs.

According to an embodiment of the present disclosure, the control module 130 may receive the remaining capacity of the battery of the electronic device 100 from the power management module 130 periodically and may determine the battery available time period, based on the remaining capacity of the battery and the power use ratio about at least one or more operations. For example, the control module 130 may iteratively determine the battery available time period every given period.

According to an embodiment of the present disclosure, the control module 130 may receive the remaining capacity of the battery of the electronic device 100 whenever an event is generated at the electronic device 100 and may determine the battery available time period, based on the remaining capacity of the battery and the power use ratio about at least one or more operations. For example, the event may be at least one of a termination of an application, execution of an application, or changing a state of the electronic device 100, for example, changing into an active state.

According to an embodiment of the present disclosure, the electronic device 100 presents battery related information, such as the battery available time period and the like determined from the operating history and the remaining capacity of the battery of the electronic device 100, through an output device (e.g., a display, a speaker, a motor, or the like) functionally connected with the electronic device 100.

For example, the control module 130 may present the remaining capacity of the battery using an image (e.g., an icon). For example, the control module 130 may present the battery available time period, determined through an operation according to the present disclosure, together with an image (e.g., an icon). The battery available time period may be presented to include an image or a text having the form of "Hour:Minute" (00:00).

According to an embodiment of the present disclosure, the control module 130 may obtain charging history (e.g., a charging pattern).

According to an embodiment of the present disclosure, the control module 130 may store the charging history when a battery of the electronic device 100 is charged. The charging history may include information about an environment where the electronic device 100 was charged. For example, the charging history may include at least one of a location where an electronic device was charged, a charging start time, a charging completion time, a charging capacity, a charging method (e.g., a travel charger, charging via a vehicle, wireless charging, wired charging, and the like), a charging date, a charging day, a charging iteration count, or a charging current.

For example, the electronic device 100 may present the remaining capacity of the battery or the battery available time period, based on the charging history. For example, since a portable electronic device including a battery is generally charged at a user's home, an office, and a frequently visiting place, warning of the remaining battery amount may be carried out when there is a relatively low remaining battery at such places. For example, when the electronic device 100 is determined as being at a place where a battery can be charged, the electronic device 100 may make a warning sign about the remaining battery amount when the remaining battery amount is about 30%. When the electronic device 100 is determined as not being at a place where a battery can be charged, the electronic device 100 may make a warning sign about the remaining battery amount when the remaining battery amount is about 50%. A sign about the remaining capacity of the battery amount may be changed relatively based on the charging history, the remaining capacity of the battery, a battery available time period, and the like, but is not limited thereto.

According to an embodiment of the present disclosure, the control module 130 determines charging probability of the electronic device 100, based on the charging history. The control module 130 may apply the charging probability to the battery related information when the charging probability of the electronic device 100 is less than a specified value.

For example, the control module 130 may determine the charging probability of an electronic device when at least one of the remaining capacity of the battery of the electronic device and the battery available time period of the electronic device becomes less than a setting value.

For example, the control module 130 may determine the charging probability, based on a position of the electronic device 100. For example, the control module 130 may recognize a position of the electronic device 100, and the charging probability may be determined as being low, when the position of the electronic device 100 is not included in a charging position (e.g., a place/location where changing was performed) included in the charging history. Alternatively, for example, when it is determined as being a specified distance away from a place/location where charging is frequently carried out, the control module 130 may determine the charging probability of the electronic device 100 as being low.

For example, the control module 130 may determine the charging history or the charging probability using a weight. For example, a weight added to a place/location where charging is frequently performed and the electronic device 100 stays for a relatively long time may be greater than that added to a place/location where charging is not frequently performed and the electronic device 100 does not stay for a relatively long time.

The control module 130 according to the present disclosure may include at least one or more processors.

The input/output interface unit 140 informs a user of battery related information including the battery available time period.

The input/output interface unit 140 may receive input information entered by a user and may output information processed at the electronic device 100 to a user in various forms such as text, picture, video, sound, vibration, and the like.

According to an embodiment of the present disclosure, the input/output interface unit 140 may convert the battery available time period into voice data and may output the voice data to a user through a speaker. Alternatively, the input/output interface unit 140 may display the battery available time period to a user through a display device in the form of multimedia data, text data, and the like.

According to an embodiment of the present disclosure, the input/output interface unit 140 may display a remaining use time of an electronic device in the form of "Hour: Minute" (00:00), based on a using pattern of a user (e.g., an operating history), thereby making it possible for a user to recognize it more easily.

Alternatively, the input/output interface unit 140 may change a battery sign, based on a charging pattern of an electronic device. Accordingly, a user may recognize the battery available time period and an environment that can provide charging more efficiently. For example, the charging pattern may include at least one of a charging position, a charging execution time, a charging iteration count, a charging day, or a charging execution method.

The input/output interface unit 140 may include input devices, such as a key pad, a dome switch, a touch pad (capacitive/resistive), a jog wheel, a jog switch, a hardware (H/W) button, output devices, such as a touch screen, a liquid crystal display, a thin film transistor-liquid crystal display, an organic light-emitting diode, a flexible display, a three-dimensional (3D) display, and the like, and software modules for driving the input and output devices. Further, the input/output interface unit 140 may be implemented with a touch screen where an input device and an output device are integrated.

An electronic device according to an embodiment of the present disclosure may include a power management module configured to detect a remaining capacity of a battery functionally connected to the electronic device, and a control module configured to obtain the operating history about one or more operations which the electronic device performs, determine the power use ratio about the one or more operations, based on the operating history, and determine a battery available time period, based on the power use ratio and the remaining capacity of the battery functionally connected to the electronic device.

The control module may obtain charging history including at least one of a position where the battery was charged or a time when the battery was charged, as the operating history.

The electronic device may further include an input/output interface unit configured to display battery related information including the battery available time period.

The control module may be further configured to determine charging probability of the electronic device, based on the charging history of the electronic device, and to apply the charging probability to display the battery related information when the charging probability of the electronic device is less than a value.

According to various embodiments of the present disclosure, the control module may determine the charging probability, based on the position of the electronic device.

According to various embodiments of the present disclosure, the power management module may be further configured to check a remaining capacity of the battery whenever an event is generated at the electronic device, and to determine the battery available time period, based on the power use ratio at occurrence of the event and the checked remaining capacity of the battery.

According to various embodiments of the present disclosure, the electronic device may further include a storage unit configured to store the operating history collected into database according to at least one of an application type or a use condition with respect to the one or more operations.

Table 1 illustrates an operating history according to an embodiment of the present disclosure.

TABLE 1

| Group | Operation | Display condition | network | Operating time (cumulative operating time) |
|---|---|---|---|---|
| GRP1 | Standby state 1 | OFF | 3G | 100 |
| | Standby state 2 | Indoor | 3G | 1 |
| | Home screen | Indoor | 4G | 5 |
| GRP2 | Still image capture | Outdoor | 4G | 2 |
| | Video capture | Indoor | 4G | 1 |
| | Audio streaming | OFF | 3G | 10 |
| | Video streaming | Indoor | WIFI | 10 |
| GRP3 | SNS APP1 | Indoor | WIFI | 10 |
| | SNS APP2 | Indoor | 3G | 8 |
| GRP4 | GAME 1 | Indoor | WIFI | 20 |
| | GAME 1 | Indoor | 3G | 5 |
| GRP5 | E-MAIL | Indoor | WIFI | 2 |
| | E-MAIL | Outdoor | WIFI | 1 |
| | BROWSING | Indoor | WIFI | 12 |
| | BROWSING | Outdoor | 3G | 3 |
| GRP4 | WALKING | Outdoor | 3G | 20 |
| | RUNNING | Outdoor | 4G | 5 |
| | HEART RATE SENSING | Outdoor | 4G | 1 |
| ... | ... | ... | ... | ... |

The operating history according to an embodiment of the present disclosure may include cumulative operating times each of which is obtained by accumulating an operating time of each operation of an electronic device. The operating history (or operating history information) may include operating time of each of operations and power usage consumed by each of the operations. The power use ratio of an operation of an electronic device is obtained based at least on the operating history. For example, if 100 mAh was consumed by 3 operations (e.g., an operation A, an operation B, and an operation C) during 5 minutes and 120 mAh was consumed by the three operations and an operation D during the next 5 minutes, then the electronic device may determine that the power use ratio of the operation D is 20 mAh/5 minutes. The example provided above does not limit the scope of the disclosure, and other various methods for determining the power use ratio may be possible.

According to an embodiment of the present disclosure, the operating history may be information collected into database according to a use condition with respect to the one or more operations, as illustrated in the table 1. The use condition may include at least one of a communication network (e.g., a network) condition and a display (e.g., luminance) condition.

Furthermore, the operating history may be information collected into database according to an application type with respect to the one or more operations, as illustrated in the table 1. For example, the operating history according to an application type may include a cumulative use time according to the application type.

The following Table 2 illustrates a charging history according to an embodiment of the present disclosure.

TABLE 2

| Charging method | Charging position | Charging day | Charging start time | Charging end time | Charging iteration count |
|---|---|---|---|---|---|
| Charging cable | Home | Weekday | 19:00 | 20:00 | 3 |
| Charging cable | Home | Weekday | 23:00 | 06:00 | 5 |
| Charging cable | Home | Weekend | 21:00 | 23:00 | 4 |
| USB power | Office | Weekday | 13:00 | 15:00 | 6 |
| Wireless charging | Cafe | Weekend | 12:00 | 13:30 | 2 |
| Charging cable | neighboring houses | Weekend | 16:00 | 17:00 | 1 |
| ... | ... | ... | ... | ... | ... |

The operating history according to an embodiment of the present disclosure may include charging history (e.g., a charging pattern) obtained by accumulating a charging history of the electronic device 100.

For example, the charging history may include at least one of a charging position, charging execution time, a charging iteration count (e.g., an iterative count), a charging date, or a charging method.

Information that allows a user to charge an electronic device in a timely fashion using the charging history may be provided. Alternatively, charging probability of the electronic device 100 may be determined, and the charging probability may be applied to battery related information when the charging probability of the electronic device 100 is less than a specified value. For example, when a recognized position of the electronic device 100 corresponds to a charging position included in the charging history, a warning sign about the remaining battery amount may be performed regarding a relatively low remaining battery amount.

Figure 2:
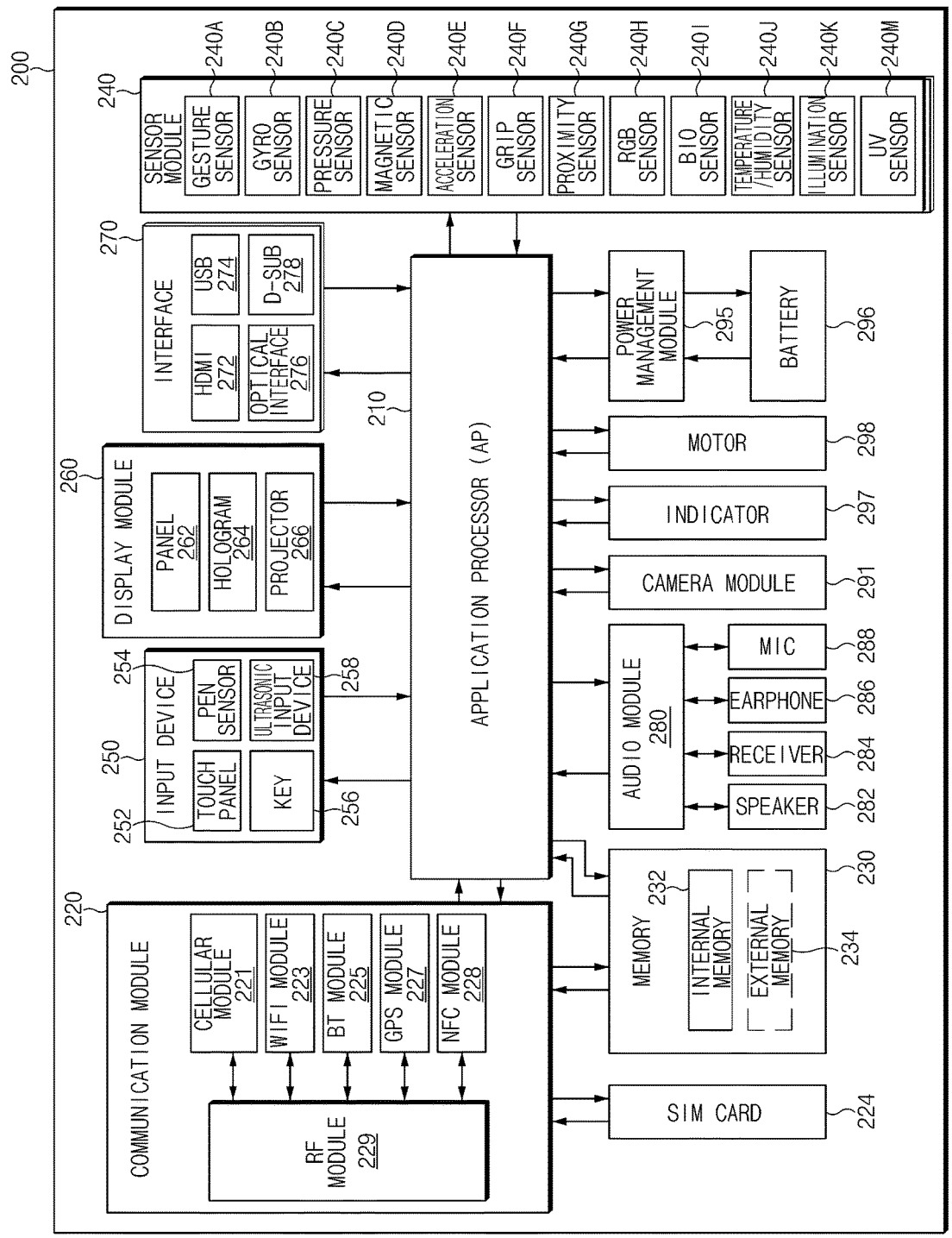
FIG. 2 is a block diagram illustrating a configuration of an electronic device according to an embodiment of the present disclosure.

FIG. 2 is a block diagram illustrating an electronic device according to various embodiments of the present disclosure.

An electronic device 200 may include a part or all of components of the electronic device 100 illustrated in FIG. 1.

Referring to FIG. 2, the electronic device 200 includes an application processors (AP) 210, a communication module 220, a subscriber identification module (SIM) card 224, a memory 230, a sensor module 240, an input device 250, a display module 260, an interface 270, an audio module 280, a camera module 291, a power management module 295, a battery 296, an indicator 297, and a motor 298.

The AP 210 drives an operating system (OS) or an application to control a plurality of hardware or software components connected to the AP 210 and processes and computes a variety of data including multimedia data. The AP 210 may be implemented with a System on Chip (SoC), for example. According to an embodiment of the present disclosure, the AP 210 may further include a graphic processing unit (GPU).

The AP 210 determines a battery available time period, based on the operating history and the remaining capacity of the battery 296. The AP 210 obtains the operating history about one or more operations performed at the electronic device 200 and determines the power use ratio about the one or more operations based on the operating history. The AP 210 determines the battery available time period, based on the power use ratio and the remaining capacity of the battery 296. For example, the AP 210 may determine the battery available time period of the electronic device 200 periodically. Alternatively, the AP 210 may determine the battery available time period whenever an event is generated at the electronic device 200.

For example, the AP 210 may obtain charging history (e.g., a charging pattern) as the operating history. For example, the AP 210 may store charging history if the battery 296 of the electronic device 200 is charged. Alternatively, the AP 210 may determine charging probability of the electronic device 200, based on the charging history. For example, when the charging probability of the electronic device 200 is less than a specified value, the AP 210 may apply the charging probability to battery related information. Alternatively, the AP 210 may determine the charging history or the charging probability using a weight.

The communication module 220 transmits and receives data when conveying communications between other electronic devices connected with the electronic device 200 through a network. According to an embodiment of the present disclosure, the communication module 220 may include a cellular module 221, a wireless-fidelity (Wi-Fi) module 223, a Bluetooth (BT) module 225, a global positioning system (GPS) module 227, a near field communication (NFC) module 228, and a radio frequency (RF) module 229.

The cellular module 221 provides voice communication, video communication, a character service, an Internet service, and the like through a communication network (e.g., Long Term Evolution (LTE), LTE Advanced (LTE-A), Code Division Multiple Access (CDMA), Wideband CDMA (WCDMA), Universal Mobile Telecommunications Systems (UMTS), Wireless Broadband (WiBro), Global System for Mobile Communication (GSM), or the like). Also, the cellular module 221 performs discrimination and authentication of an electronic device within a communication network using a SIM card 224, for example. According to an embodiment of the present disclosure, the cellular module 221 performs at least a portion of functions that the AP 210 provides. For example, the cellular module 221 may perform at least a portion of a multimedia control function.

According to an embodiment of the present disclosure, the cellular module 221 may include a communication processor (CP). Furthermore, the cellular module 221 may be implemented with, for example, an SoC.

Although components such as the cellular module 221 (e.g., a communication processor), the memory 230, the power management module 295, and the like are illustrated as components independent of the AP 210, the AP 210 according to an embodiment of the present disclosure may be implemented to include at least a portion (e.g., a cellular module 221) of the above components.

According to an embodiment of the present disclosure, the AP 210 or the cellular module 221 (e.g., a communication processor) loads and processes an instruction or data received from nonvolatile memories respectively connected thereto or from at least one of other elements at the nonvolatile memory. Also, the AP 210 or the cellular module 221 stores data received from at least one of other elements or generated by at least one of other elements at a nonvolatile memory.

Each of the Wi-Fi module 223, the BT module 225, the GPS module 227, and the NFC module 228 may include a processor for processing data exchanged through a corresponding module, for example. In FIG. 2, the cellular module 221, the Wi-Fi module 223, the BT module 225, the GPS module 227, and the NFC module 228 may be illustrated as separate blocks.

According to an embodiment of the present disclosure, at least a portion (e.g., two or more components) of the cellular module 221, the Wi-Fi module 223, the BT module 225, the GPS module 227, and the NFC module 228 may be included within one Integrated Circuit (IC) or an IC package. For example, at least a portion (e.g., a communication processor corresponding to the cellular module 221 and a Wi-Fi processor corresponding to the Wi-Fi module 223) of communication processors corresponding to the cellular module 221, the Wi-Fi module 223, the BT module 225, the GPS module 227, and the NFC module 228 may be implemented with one SoC.

The RF module 229 transmits and receives data, for example, an RF signal. The RF module 229 may include a transceiver, a power amplifier module (PAM), a frequency filter, or low noise amplifier (LNA). Furthermore, the RF module 229 may further include a conductor or a conducting wire for transmitting and receiving an electromagnetic wave in a space in wireless communication. In FIG. 2, the cellular module 221, the Wi-Fi module 223, the BT module 225, the GPS module 227, and the NFC module 228 may be illustrated as sharing one RF module 229, but according to an embodiment of the present disclosure, at least one of the cellular module 221, the Wi-Fi module 223, the BT module 225, the GPS module 227, or the NFC module 228 may transmit and receive an RF signal through a separate RF module.

The SIM card 224 may be inserted to a slot formed at a specific position of the electronic device 200. The SIM card 224 may include unique identify information (e.g., integrated circuit card identifier (ICCID)) or subscriber information (e.g., integrated mobile subscriber identity (IMSI)).

The memory 230 may include an embedded (or internal) memory 232 or an external memory 234. For example, the embedded memory 232 may include at least one of a volatile memory (e.g., dynamic random access memory (RAM) (DRAM), static RAM (SRAM), synchronous dynamic RAM (SDRAM), etc.), or a nonvolatile memory (e.g., a dynamic random access memory (DRAM), a static RAM (SRAM), or a synchronous DRAM (SDRAM)) and a non-volatile memory (e.g., a one-time programmable read only memory (ROM) (OTPROM), a programmable ROM (PROM), an erasable and programmable ROM (EPROM), an electrically erasable and programmable ROM (EEPROM), a mask ROM, a flash ROM, a NAND flash memory, or a NOR flash memory).

According to an embodiment of the present disclosure, the embedded memory 232 may be a solid state drive (SSD). The external memory 234 may include a flash drive, for example, compact flash (CF), secure digital (SD), micro secure digital (Micro-SD), mini secure digital (Mini-SD), extreme digital (xD) or a memory stick. The external memory 234 may be functionally connected with the electronic device 200 through various interfaces. According to an embodiment of the present disclosure, the electronic device 200 may further include a storage device (or storage medium) such as a hard disk drive.

The memory 230 stores the operating history about one or more operations that the electronic device 200 performs. For example, the memory 230 may store cumulative use times, each obtained by accumulating a use time of each operation, with respect to the one or more operations of the electronic device 200 as the operating history. Alternatively, the memory 230 may store charging history according to charging of the electronic device 200 as the operating history. The charging history may include at least one of a position where the battery 296 was charged or a time when the battery 296 was charged, for example.

Further, the memory 230 stores the operating history that is collected into database according to at least one of an application type or a use condition with respect to the one or more operations. For example, the use condition may be a communication network condition, a display condition, or the like.

The sensor module 240 measures a physical quantity or detects an operation state of the electronic device 200. The sensor module 240 converts the measured or detected information to an electric signal. The sensor module 240 may include at least one of a gesture sensor 240A, a gyro sensor 240B, a pressure sensor 240C, a magnetic sensor 240D, an acceleration sensor 240E, a grip sensor 240F, a proximity sensor 240G, a color sensor 240H (e.g., red, green, blue (RGB) sensor), a living body sensor (or bio sensor) 240I, a temperature/humidity sensor 240J, an illuminance sensor 240K, or an ultraviolet (UV) sensor 240M. The sensor module 240 may further include, for example, an E-nose sensor, an electromyography sensor (EMG) sensor, an electroencephalogram (EEG) sensor, an electrocardiogram (ECG) sensor, a photoplethysmographic (PPG) sensor, an infrared (IR) sensor, an iris sensor, a fingerprint sensor, and the like. The sensor module 240 may further include a control circuit for controlling at least one or more sensors included therein.

The input device 250 may include a touch panel 252, a (digital) pen sensor 254, a key 256, or an ultrasonic input unit 258. The touch panel 252 recognizes a touch input using at least one of capacitive, resistive, infrared and ultrasonic detecting methods. Also, the touch panel 252 may further include a control circuit. In the case of using the capacitive detecting method, a physical contact or proximity recognition is possible. The touch panel 252 may further include a tactile layer. In this case, the touch panel 252 may provide a tactile reaction to a user. The touch panel 252 may generate a touch event associated with execution of a specific function using position associated information.

The (digital) pen sensor 254 may be implemented in a similar or same manner as the method of receiving a touch input of a user or may be implemented using an additional sheet for recognition. The key 256 may include, for example, a physical button, an optical key, or a keypad. The ultrasonic input device 258, which is an input device for generating an ultrasonic signal, enables the electronic device 200 to sense detect a sound wave through a microphone (e.g., a microphone 288) so as to identify data, wherein the ultrasonic input device 258 is capable of wireless recognition. According to an embodiment of the present disclosure, the electronic device 200 may use the communication module 220 so as to receive a user input from an external device (e.g., a computer or server) connected to the communication module 220.

The display 260 (e.g., the input/output interface unit 140) informs a user of battery related information including the battery available time period. The display 260 displays the battery available time period to a user in the form of multimedia data, text data, or the like. For example, the display 260 may present a remaining use time of the electronic device 200 in the form of "Hour:Minute" (00:00), based on the operating history (e.g., a using pattern) of a user, thereby making it possible for a user to recognize it more easily. Alternatively, the display 260 may change a battery sign, based on the charging history (e.g., a charging pattern) of the electronic device 200.

The display 260 may include a panel 262, a hologram device 264, or a projector 266. According to an embodiment of the present disclosure, the display 260 may include a control circuit for controlling the panel 262, the hologram device 264, or the projector 266. The panel 262 may be a liquid-crystal display (LCD) or an active-matrix organic light-emitting diode (AMOLED). The panel 264 may be, for example, flexible, transparent or wearable. The panel 264 and the touch panel 252 may be integrated into a single module. The hologram device 264 displays a stereoscopic image in a space using a light interference phenomenon. The projector 266 projects light onto a screen so as to display an image. The screen may be arranged in the inside or the outside of the electronic device 200.

The interface 270 may include, for example, a high-definition multimedia interface (HDMI) 272, a universal serial bus (USB) 274, an optical interface 276, or a D-sub (D-subminiature) 278. Alternatively, the interface 270 may include, for example, a mobile high definition link (MHL) interface, a SD card/multi-media card (MMC) interface, or an infrared data association (IrDA) standard interface.

The audio module 280 converts a sound and an electric signal in dual directions. The audio module 280 may process, for example, sound information that is input or output through a speaker 282, a receiver 284, an earphone 286, or a microphone 288.

According to an embodiment of the present disclosure, the camera module 291 for capturing a still image or a video may include at least one image sensor (e.g., a front sensor or a rear sensor), a lens, an image signal processor (ISP), or a flash (e.g., a light emitting diode (LED) or a xenon lamp).

The power management module 295 (e.g., the power management module 110) manages power of the electronic device 200. Although not illustrated, the power management module 295 may include, for example, a power management integrated circuit (PMIC) a charger IC, or a battery gauge.

The PMIC may be mounted on an integrated circuit or an SoC semiconductor. A charging method may be classified into a wired charging method and a wireless charging method. The charger IC charges a battery, and prevents an overvoltage or an overcurrent from being introduced from a charger. According to an embodiment of the present disclosure, the charger IC may include a charger IC for at least one of the wired charging method and the wireless charging method. The wireless charging method may include, for example, a magnetic resonance method, a magnetic induction method or an electromagnetic method, and may include an additional circuit, for example, a coil loop, a resonant circuit, or a rectifier, and the like.

The battery gauge measures, for example, a remaining capacity of the battery 296 and a voltage, current or temperature thereof while the battery is charged. The battery 296 stores or generates electricity, and supplies power to the electronic device 200 using the stored or generated electricity. The battery 296 may include, for example, a rechargeable battery or a solar battery.

The indicator 297 displays a specific state of the electronic device 200 or a part thereof (e.g., the AP 210), such as a booting state, a message state, a charging state, and the like. The motor 298 converts an electrical signal into a mechanical vibration. Although not illustrated, a processing device (e.g., a GPU) for supporting a mobile TV may be included in the electronic device 200. The processing device for supporting a mobile TV may process media data according to the standards of DMB, digital video broadcasting (DVB) or media flow.

Each of the above-mentioned elements of the electronic device according to various embodiments of the present disclosure may be configured with one or more components, and the names of the elements may be changed according to the type of the electronic device. The electronic device according to various embodiments of the present disclosure may include at least one of the above-mentioned elements, and some elements may be omitted or other additional elements may be added. Further, some of the elements of the electronic device according to various embodiments of the present disclosure may be combined with each other so as to form one entity, so that the functions of the elements may be performed in the same manner as before the combination.

Figure 3:
FIG. 3 illustrates battery related information displayed on a display screen of an electronic device, according to an embodiment of the present disclosure.

FIG. 3 illustrates battery related information displayed on a display screen of an electronic device, according to an embodiment of the present disclosure.

An electronic device 100 may display battery related information, for example, through an input/output interface unit 140. For example, the electronic device 100 may display the battery related information by displaying an image (e.g., an icon) on a screen. The image (e.g., an icon) may be a battery-shaped icon, and a user may recognize a remaining capacity of a battery through the image changed in various manners. For example, the electronic device 100 may display the remaining capacity amount against a battery capacity as a ratio (%) or may display a battery-shaped icon such that the battery-shaped icon is filled or emptied to correspond to the remaining capacity.

According to an embodiment of the present disclosure, the electronic device 100 may determine a battery available time period 10, based on the operating history and may display the determined battery available time period 10 together with the battery related information (e.g., an icon). In some embodiments of the present disclosure, it may be possible to display only the battery available time period 10 without any other information associated with a battery.

The electronic device 100 may provide additional information according to the remaining capacity of the battery, for example. The electronic device 100 may change a color of a battery icon according to the remaining capacity of the battery. According to an embodiment, the battery icon may be displayed in green when the remaining capacity of the battery ranges from 100% to 50%, in yellow when the remaining capacity of the battery ranges from 50% to 10%, and in red when the remaining capacity of the battery is below 10%. For example, the battery icon may flicker when the remaining capacity of the battery is below 5%.

According to an embodiment of the present disclosure, the electronic device 100 may display battery related information, based on the charging history. For example, referring to Table 2, a user may employ the electronic device 100 at a place where a charging history exists or at a place where a charging history does not exist. The electronic device 100 may dynamically change the ranges in which an icon color is changed, as a consequence of determining that a user employs the electronic device 100 at a place where a charging history does not exist or at a place where a weight about a charging history is relatively low. For example, at a place where a charging history does not exist, the electronic device 100 may display the battery icon in green when the remaining capacity of the battery ranges from 100% to 70%, in yellow when the remaining capacity of the battery ranges from 70% to 30%, and in red when the remaining capacity of the battery is below 30%. For example, the battery icon may flicker when the remaining capacity of the battery is below 10%. An operation of the present disclosure is described using specific numbers, but is not limited thereto.

According to an embodiment of the present disclosure, the electronic device 100 may add or subtract the battery available time period 10, based on the charging history. For example, the electronic device 100 may add an offset according to a charging pattern of a user to the battery available time period 10. For example, when the battery available time period 10 (or an available time period of an electronic device) determined using the operating history is 2 hours, the electronic device 100 may display an hour and a half (not two hours) as an available time period to be displayed on a screen, as a consequence of determining that the electronic device 100 is located for a specified time at a place where charging history does not exist.

According to an embodiment of the present disclosure, the electronic device 100 may control an application or a function being executed through the electronic device 100, based on the charging history. For example, various settings of the electronic device 100 may be changed based on the charging history.

According to an embodiment of the present disclosure, when operating in a sleep state (e.g., a sleep mode), the electronic device 100 may release the sleep state if it is determined as being at a chargeable state or in a charging position. Functions that the electronic device 100 can control according to a chargeable state or a charging position may include at least one of screen brightness, a lighting time, an operating frequency of a processor, an automatic backup function, or volume, but is not limited thereto.

According to an embodiment of the present disclosure, the electronic device 100 may enter the sleep state if it is determined as entering a place where charging history does not exist or staying for a specified time thereat.

Figure 4:
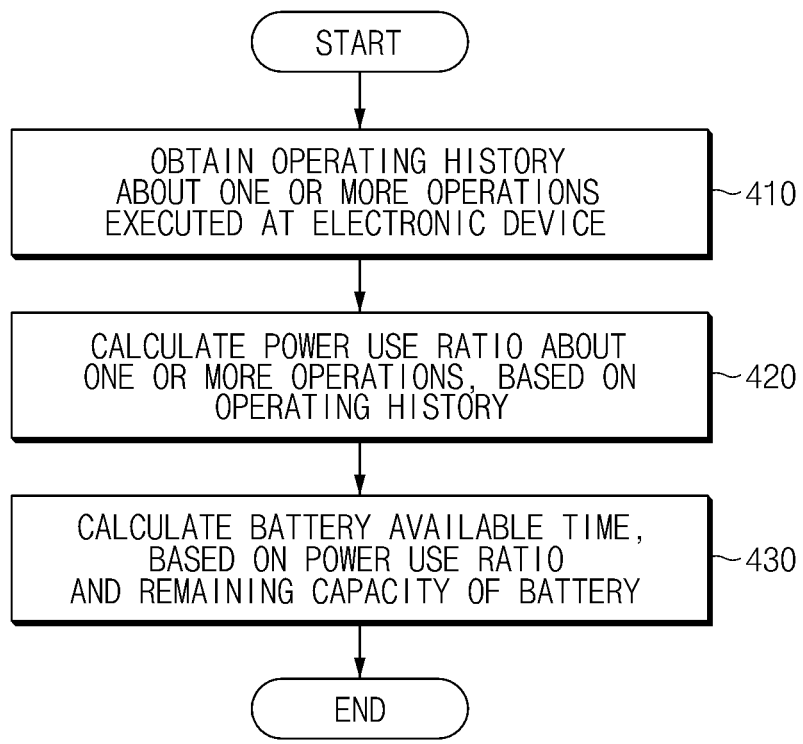
FIG. 4 is a flow chart illustrating a method for displaying battery related information of an electronic device according to an embodiment of the present disclosure.

FIG. 4 is a flow chart illustrating a method for displaying battery related information of an electronic device according to an embodiment of the present disclosure.

Figure 5:
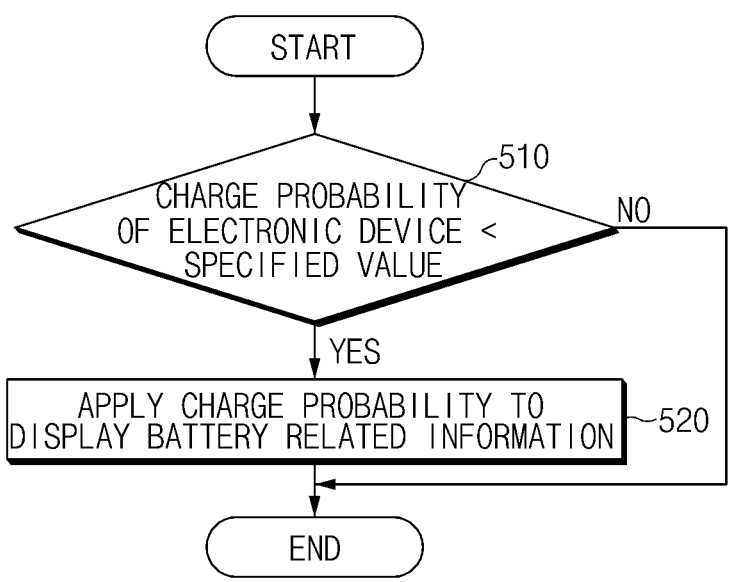
FIG. 5 is a flow chart illustrating a method for controlling an operation of an electronic device using charging history information at an electronic device, according to an embodiment of the present disclosure.

Flow charts illustrated in FIGS. 4 and 5 may include, for example, operations being processed time-sequentially at an electronic device 100 illustrated in FIG. 1. Accordingly, even though omitted hereinafter, the above description about the electronic device 100 illustrated in FIG. 1 may be applied to the flow charts illustrated in FIGS. 4 and 5.

Operations described with reference to a process or method illustrated in FIGS. 4 and 5 may be executed sequentially, in parallel, repeatedly, or in a heuristic method as well as in a time sequence. Also, the operations may be executed in different sequences, a portion of the operations may be omitted, or other operations may be added thereto.

Referring to FIG. 4, in step 410, a control module 130 obtains, for example, the operating history about one or more operations that an electronic device 100 performs. For example, the control module 130 may obtain the operating history including execution information of an application. For example, cumulative use times each obtained by accumulating a use time of each operation of the electronic device 100 may be collected into database. For example, the control module 130 may update the operating history as time passes.

In step 420, the control module 130 determines or calculates the power use ratio about the one or more operations, for example, based on the operating history.

In step 430, the control module 130 determines or calculates a battery available time period, for example, based on the power use ratio and a remaining capacity of a battery. For example, the control module 130 may display battery related information, including the battery available time period determined thereby, through an input/output interface unit 140.

According to an embodiment of the present disclosure, the control module 130 may receive the remaining capacity of the battery of an electronic device periodically and may periodically determine the battery available time period, based on the power use ratio and the remaining capacity of the battery.

Alternatively, the control module 130 may check the remaining capacity of the battery of an electronic device whenever an event is generated at the electronic device and may determine the battery available time period, based on the power use ratio and the remaining capacity of the battery.

FIG. 5 is a flow chart illustrating a method for controlling an operation of an electronic device using charging history at an electronic device 100, according to an embodiment of the present disclosure.

Referring to FIG. 5, in step 510, the control module 130 determines charging probability of an electronic device, based on charging history (e.g., a charging pattern). For example, the charging probability of an electronic device may be compared with a specified value. For example, the charging probability may be a numerical value obtained based on a position of the electronic device, the date and time, and the like. For example, the charging pattern may include at least one of a charging position, a charging execution time, a charging iteration count, a charging day, or a charging execution method.

As a consequence of determining that the charging probability of an electronic device is less than a specified value, in step 520, the control module 130 applies the charging probability to display battery related information of the electronic device 100.

According to an embodiment of the present disclosure, the control module 130 may determine the charging probability, based on at least one the charging iteration count of a charging pattern and a charging position.

Alternatively, the control module 130 may receive a position of the electronic device 100, and when the position is not included in the charging position, that charging is impossible may be determined by the control module 130.

A method for displaying battery related information of an electronic device according to various embodiments of the present disclosure may include obtaining the operating history about one or more operations which the electronic device performs, determining the power use ratio about each of the one or more operations, based on the operating history, and determining a battery available time period, based on the power use ratio and a remaining capacity of a battery supplying power to the electronic device.

According to an embodiment of the present disclosure, the operating history may include cumulative use times, each obtained by accumulating a use time of each of one or more operations, with respect to the one or more operations.

According to an embodiment of the present disclosure, obtaining the operating history may include obtaining the charging history including at least one of a position where the battery was charged or a time when the battery was charged, as the operating history.

According to an embodiment of the present disclosure, the method may further include displaying battery related information including the battery available time period.

According to an embodiment of the present disclosure, the method may further include determining charging probability of the electronic device, based on the charging history of the electronic device, and applying the charging probability to display the battery related information when the charging probability of the electronic device is less than a value.

According to an embodiment of the present disclosure, the method may further include receiving a position of the electronic device, and determining the charging probability may include determining the charging probability based on the position of the electronic device.

According to an embodiment of the present disclosure, determining the battery available time period may include receiving a remaining capacity of the battery periodically, and periodically determining the battery available time period based on the power use ratio and the received remaining capacity of the battery.

According to an embodiment of the present disclosure, determining the battery available time period may include receiving a remaining capacity of the battery whenever an event is generated at the electronic device, and determining the battery available time period based on the power use ratio and the received remaining capacity of the battery.

According to an embodiment of the present disclosure, the event may include at least one of a termination of an application, an execution of an application, and a change of a state of the electronic device, for example, an entry to an active state.

According to an embodiment of the present disclosure, the determining of a battery available time period may include obtaining current consumption about the one or more operations, determining a current use quantity according to the power use ratio, based on the current consumption, and comparing the current use quantity and the remaining capacity of the battery to determine the battery available time period.

According to an embodiment of the present disclosure, the operating history may be information collected into database according to at least one of an application type or a use condition with respect to the one or more operations.

According to an embodiment of the present disclosure, the use condition may be at least one of a communication network condition or a display condition.

According to an embodiment of the present disclosure, at least a portion of an apparatus (e.g., modules or functions thereof) or a method (e.g., operations) according to various embodiments of the present disclosure, for example, may be implemented by instructions stored in a non-transitory computer-readable storage media in the form of a programmable module. The instruction, when executed by one or more processors (e.g., the processor 210), may perform a function corresponding to the instruction. The non-transitory computer-readable storage media, for example, may be the memory 230. At least a portion of the programming module, for example, may be implemented (e.g., executed) by the processor 210. At least a portion of the programming module may include a module, a program, a routine, sets of instructions, or a process for performing one or more functions.

The above-described methods may be translated into a program executable on a computer, and may be implemented on a general-purpose digital computer that executes the program using a non-transitory computer-readable recording medium. The non-transitory computer-readable recording medium may include storage media such as magnetic media (e.g., a ROM, a floptical disk, a hard disk, and the like) and optical media (e.g., a compact disc ROM (CD-ROM), a digital versatile disc (DVD), and the like).

An electronic device and a method according to an embodiment of the present disclosure may make it possible to recognize a remaining capacity of a battery by using a battery available time period of an electronic device more easily. The battery available time period may be determined using the operating history of an electronic device, thereby improving accuracy of the battery available time period.

Also, a remaining capacity of a battery or a battery available time period of the electronic device may be adjusted according to a charging pattern of the electronic device, thereby improving a user's convenience.

Depending on the embodiment, some or all of the steps, operations, and/or functions described herein may be implemented or otherwise performed, at least in part, using one or more controllers and/or processors running instruction(s), program(s), interactive data structure(s), client and/or server components, where such instruction(s), program(s), interactive data structure(s), client and/or server components are stored in one or more non-transitory computer-readable media. The one or more non-transitory computer-readable media may be instantiated in software, firmware, hardware, and/or any combination thereof.

The one or more non-transitory computer-readable media and/or means for implementing/performing one or more operations/steps/modules of embodiments of the present innovation(s) may include, without limitation, application-specific integrated circuits ("ASICs"), standard integrated circuits, controllers executing appropriate instructions, and including microcontrollers and/or embedded controllers, field-programmable gate arrays ("FPGAs"), complex programmable logic devices ("CPLDs"), and the like. Some or all of any system components and/or data structures may also be stored as contents (e.g., as executable or other non-transitory machine-readable software instructions or structured data) on a non-transitory computer-readable medium (e.g., as a hard disk; a memory; a computer network or cellular wireless network or other data transmission medium; or a portable media article to be read by an appropriate drive or via an appropriate connection, such as a DVD or flash memory device) so as to enable or configure the computer-readable medium and/or one or more associated computing systems or devices to execute or otherwise use or provide the contents to perform at least some of the described techniques. Some or all of any system components and data structures may also be stored as data signals on a variety of non-transitory computer-readable transmission mediums, from which they are read and then transmitted, including across wireless-based and wired/cable-based mediums, and may take a variety of forms (e.g., as part of a single or multiplexed analog signal, or as multiple discrete digital packets or frames). Thus, the term "non-transitory computer-readable medium" as used herein refers to any medium that comprises the actual performance of an operation (such as hardware circuits), that comprises programs and/or higher-level instructions to be provided to one or more processors for performance/implementation (such as instructions stored in a non-transitory memory), and/or that comprises machine-level instructions stored in, e.g., firmware or non-volatile memory. Non-transitory computer-readable media may take many forms, such as non-volatile and volatile media, including but not limited to, a floppy disk, flexible disk, hard disk, RAM, PROM, EPROM, FLASH-EPROM, EEPROM, any memory chip or cartridge, any magnetic tape, or any other magnetic medium from which a computer instruction can be read; a CD-ROM, DVD, or any other optical medium from which a computer instruction can be read, or any other non-transitory medium from which a computer instruction can be read.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. A method for displaying battery information of an electronic device, the method comprising:
    obtaining an operating history about one or more operations performed by the electronic device;
    determining a power use ratio about each of the one or more operations, based on the operating history; and
    determining an available time period for which a battery supplying power to the electronic device is capable to supply power to the electronic device, based on the power use ratio of at least one operation which is currently running and a remaining capacity of the battery.

2. The method of claim 1, wherein the operating history comprises cumulative operating times, each obtained by accumulating an operating time of each of the one or more operations, of the one or more operations.

3. The method of claim 1, wherein obtaining the operating history comprises:
    obtaining a charging history including at least one of a position where the battery was charged or a time when the battery was charged, as the operating history.

4. The method of claim 1, further comprising:
    displaying the battery information including the available time period.

5. The method of claim 3, further comprising:
    determining charging probability of the electronic device, based on the charging history of the electronic device; and
    applying the charging probability to display the battery information when the charging probability of the electronic device is less than a value.

6. The method of claim 5, further comprising:
    receiving a position of the electronic device, and
    wherein determining the charging probability of the electronic device comprises:
    determining the charging probability, based on the position of the electronic device.

7. The method of claim 1, wherein determining the available time period comprises:
    receiving the remaining capacity of the battery periodically; and
    periodically determining the available time period, based on the power use ratio and the received remaining capacity of the battery.

8. The method of claim 1, wherein determining the available time period comprises:
    receiving the remaining capacity of the battery whenever an event is generated at the electronic device; and
    determining the available time period, based on the power use ratio and the received remaining capacity of the battery.

9. The method of claim 8, wherein the event comprises at least one of a termination of an application, an execution of an application, and a change of a state of the electronic device.

10. The method of claim 1, wherein determining the available time period comprises:
    obtaining current consumption over an interval of time about the one or more operations;
    determining a quantity of charge consumed according to the power use ratio information, based on the current consumption over an interval of time; and comparing the quantity of charge consumed and the remaining capacity of the battery to determine the available time period.

11. The method of claim 1, wherein the operating history corresponds to information collected into database based on at least one of an application type or a use condition with respect to the one or more operations.

12. The method of claim 11, wherein the use condition is at least one of a communication network condition or a display condition.

13. A non-transitory computer-readable recording media recording a program, the program, when executed by a computer, causes the computer to perform a method, the method comprising:
 obtaining an operating history about one or more operations performed by an electronic device;
 determining a power use ratio about each of the one or more operations, based on the operating history; and
 determining an available time period of a battery supplying power to the electronic device is capable to supply power to the electronic device, based on the power use ratio and a remaining capacity of the battery.

14. An electronic device comprising:
 a power management module configured to detect a remaining capacity of a battery supplying power to the electronic device; and
 a control module configured to:
 obtain an operating history about one or more operations performed by the electronic device,
 determine a power use ratio about each of the one or more operations, based on the operating history, and
 determine an available time period for which the battery is capable to supply power to the electronic device, based on the power use ratio and the remaining capacity of the battery.

15. The electronic device of claim 14, wherein the control module is further configured to obtain a charging history including at least one of a position where the battery was charged or a time when the battery was charged, as the operating history.

16. The electronic device of claim 14, further comprising:
 an input/output interface unit configured to display battery information including the available time period.

17. The electronic device of claim 15, wherein the control module is further configured to:
 determine charging probability of the electronic device, based on the charging history of the electronic device, and
 apply the charging probability to display battery information when the charging probability of the electronic device is less than a value.

18. The electronic device of claim 17, wherein the control module is further configured to determine the charging probability, based on a position of the electronic device.

19. The electronic device of claim 14, wherein the power management module is further configured to:
 check the remaining capacity of the battery whenever an event is generated at the electronic device, and
 determine the available time period, based on the power use ratio at occurrence of the event and the checked remaining capacity of the battery.

20. The electronic device of claim 14, further comprising:
 a storage unit configured to store the operating history collected into database with respect to the one or more operations according to at least one of an application type or a use condition.

\* \* \* \* \*